US010943597B2

(12) United States Patent
Kim et al.

(10) Patent No.: US 10,943,597 B2
(45) Date of Patent: Mar. 9, 2021

(54) METHOD OF CONTROLLING VOLUME IN A NOISE ADAPTIVE MANNER AND APPARATUS IMPLEMENTING THEREOF

(71) Applicant: LG ELECTRONICS INC., Seoul (KR)

(72) Inventors: Minook Kim, Seoul (KR); Sewan Gu, Seoul (KR); Jinho Sohn, Seoul (KR); Tack Sung Choi, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 16 days.

(21) Appl. No.: 16/276,371

(22) Filed: Feb. 14, 2019

(65) Prior Publication Data

US 2019/0267020 A1  Aug. 29, 2019

(30) Foreign Application Priority Data

Feb. 26, 2018  (KR) .................. 10-2018-0022856

(51) Int. Cl.
*G10L 21/00* (2013.01)
*G10L 21/0208* (2013.01)
(Continued)

(52) U.S. Cl.
CPC .......... *G10L 21/0208* (2013.01); *G10L 15/20* (2013.01); *G10L 21/034* (2013.01); *H03G 3/32* (2013.01); *G10L 13/033* (2013.01)

(58) Field of Classification Search
CPC ..... G10L 21/0208; G10L 25/78; G10L 25/48; G10L 21/00; G10L 21/02; G10L 21/0232;
(Continued)

(56) References Cited

U.S. PATENT DOCUMENTS 6,319,207 B1 * 11/2001 Naidoo .................... A61B 5/00
6,868,162 B1   3/2005 Jubien et al.
(Continued)

FOREIGN PATENT DOCUMENTS

KR  1020080064557  7/2008

OTHER PUBLICATIONS

S. Kagami, T. Fujihara, Y. Sasaki, T. Enomoto, S. Thompson and H. Mizoguchi, "Loudness measurement of human utterance to a robot in noisy environment," 2008 3rd ACM/IEEE International Conference on Human-Robot Interaction (HRI), Amsterdam, 2008, pp. 217-224, doi: 10.1145/1349822.1349851. (Year: 2008).*

*Primary Examiner* — Edgar X Guerra-Erazo
(74) *Attorney, Agent, or Firm* — Lee Hong Degerman Kang & Waimey

(57) ABSTRACT

A method for controlling volume in an apparatus having a speaker and a microphone includes receiving, at the microphone, external noise and speech of a user, and calculating sound pressure of the noise received by the microphone. The method further includes performing exception processing of the sound pressure of some or all of the noise using the calculated sound pressure and one of a speech utterance state, a speech receiving state, or a temporal length state, of the noise, mapping volume of the speech in response to the sound pressure of the external noise, synthesizing speech guidance into a sound file, outputting the sound file, via the speaker, according to the mapped volume.

20 Claims, 11 Drawing Sheets

(51) Int. Cl.
 G10L 15/20 (2006.01)
 G10L 21/034 (2013.01)
 H03G 3/32 (2006.01)
 *G10L 13/033* (2013.01)

(58) Field of Classification Search
 CPC ..... G10L 21/0364; G10L 25/03; G10L 25/60;
 G10L 25/84; G10L 15/20; G10L 13/033;
 H04N 21/42203; H04R 3/005
 See application file for complete search history.

(56) References Cited

U.S. PATENT DOCUMENTS

| | | | | |
|---|---|---|---|---|
| 7,099,821 B2* | 8/2006 | Visser | | G10L 21/0208 |
| | | | | 379/406.08 |
| 7,133,715 B1* | 11/2006 | Smits | | A61B 5/04845 |
| | | | | 600/544 |
| 7,184,556 B1* | 2/2007 | Johnson | | H03G 5/005 |
| | | | | 381/59 |
| 7,418,392 B1* | 8/2008 | Mozer | | G10L 15/26 |
| | | | | 315/307 |
| 7,530,957 B2* | 5/2009 | Givens | | G16H 40/67 |
| | | | | 600/559 |
| 7,854,704 B2* | 12/2010 | Givens | | A61B 5/123 |
| | | | | 600/559 |
| 8,085,943 B2* | 12/2011 | Bizjak | | H03G 3/3089 |
| | | | | 381/71.14 |
| 8,315,400 B2* | 11/2012 | Goldstein | | H04R 3/005 |
| | | | | 381/57 |
| 9,099,093 B2 | 8/2015 | Choi et al. | | |
| 2003/0078515 A1* | 4/2003 | Menzel et al. | | A61B 5/00 |
| 2003/0220786 A1* | 11/2003 | Chandra et al. | | G10L 19/14 |
| 2008/0167863 A1 | 7/2008 | Choi et al. | | |
| 2010/0153101 A1* | 6/2010 | Fernandes | | G10L 25/69 |
| | | | | 704/220 |

* cited by examiner

FIG. 10

| Pos | Time 1 | Time 2 | Time 3 | Time 4 | Time 5 | deviation |
|---|---|---|---|---|---|---|
| (1, 1) | 31 | 29 | 30 | 32 | 33 | 1.2 |
| (3, 5) | 51 | 32 | 33 | 34 | 15 | 7.6 |
| (7, 2) | 15 | 17 | 16 | 17 | 40 | 7.28 |

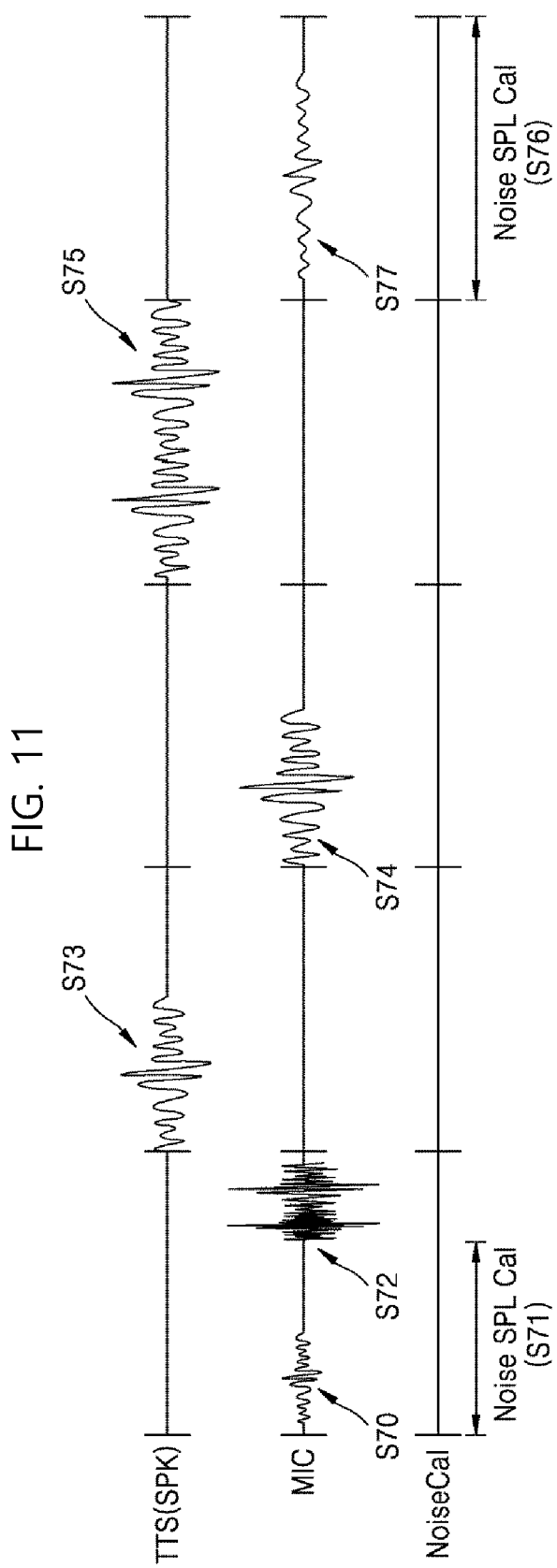

METHOD OF CONTROLLING VOLUME IN A NOISE ADAPTIVE MANNER AND APPARATUS IMPLEMENTING THEREOF

CROSS-REFERENCE TO RELATED APPLICATIONS

Pursuant to 35 U.S.C. § 119(a), this application claims the benefit of earlier filing date and right of priority to Korean Application No. 10-2018-0022856, filed on Feb. 26, 2018, the disclosure of which is incorporated herein by reference in its entirety.

BACKGROUND

1. Field of the Invention

The present invention relates to a method that controls volume in a noise adaptive manner and an apparatus for implementing such method.

2. Description of Related Art

There are various kinds of noise in the spaces where human and material exchanges are made actively such as airports, schools, government offices, hotels, offices and factories. Therefore, in the case of an apparatus such as a mobile guide robot that travels in the above-mentioned space, it is required to operate in response to various kinds of noise levels occurring in an individual zone.

For example, the contents of Korean Patent Application No. 10-2008-0064557 are shown in FIG. 1, which depicts a method for improving correctness of a speech signal according to the related art. FIG. 1 is related to analyzing a background noise signal of a receiver environment to classify a received speech signal into non-speech, unvoiced sound speech and voiced sound speech, and enhancing unvoiced sound speech or voiced sound speech classified based on the analyzed noise signal. In more detail, fast Fourier transform (FFT) is performed with respect to the separated speech signal of the unvoiced sound speech (S1), and a signal to noise ratio (SNR) is calculated (S2).

Thereafter, according to the calculated result, the intensity of the speech frame is compared with that of the noise frame (S3). When the intensity of the speech frame is greater than that of the noise frame, first calculation (S4) for adjusting the intensity of the speech frame is performed. When the intensity of the speech frame is less than that of the noise frame, second calculation (S5) is performed. According to the related art, the intensity gain (G) is set to 1 for the first operation and a root operation is performed for the noise signal with respect to an intensity gain for the second calculation.

When the related art as shown in FIG. 1 is applied, as the volume is adjusted in real time, the volume continuously fluctuates during the output of speech, which may interfere with the recognition of the user with respect to the speech. In particular, even when accidental loud noise is generated, there is a problem that the volume is unnecessarily increased as an intensity of the noise is continuously measured.

As an example, embodiments described in the present specification provide a method that a device having mobility adjusts the volume to cope with a state where noise is generated and a state where the volume is controlled, to enable a user to effectively recognize the speech.

SUMMARY

Embodiments described in the present specification may be used to solve the above-mentioned problems. An embodiment includes a method in which an apparatus that provides a user with information through sound or TTS speech outputs the speech in an adaptive manner to ambient noise so as to enhance a recognition rate of the user with respect to the speech.

A further embodiment provides a method of fixing volume of an apparatus or reducing a range of changing volume of an apparatus in a process in which the apparatus that provides the user with the information through the sound or the TTS speech outputs the speech in an adaptive manner with respect to the noise generated temporarily from the ambient and the users recognize the sound.

A still further embodiment provides a method of controlling the output volume in response to the temporal and sound pressure characteristics of the noise generated during the movement of the apparatus.

According to an embodiment, a volume control apparatus includes an exception processing unit that instructs exception processing during calculation of sound pressure of noise in consideration of a speech utterance state, a speech receiving state, or a temporal length state of noise.

According to an embodiment, the volume control apparatus includes a scenario engine unit that provides information on the speech utterance state, the speech receiving state, or the temporal length state of noise.

According to another embodiment, the volume control apparatus maps volume of the uttered speech as a first slope in response to an increase in the sound pressure of the noise and maps the volume of the uttered speech as a second slope in response to a decrease in the sound pressure of the noise, and the absolute value of the first slope is smaller than the absolute value of the second slope.

According to an embodiment, the robot includes a volume control module that instructs exception processing during the calculation of sound pressure of noise in consideration of a speech utterance state, a speech receiving state, or a temporal length state of noise, and a map storage unit that stores noise information on a space where a robot travels.

According to an embodiment, the robot includes a control unit that controls the sound pressure of the noise calculated by the volume control module to be collectively stored as noise information in the map storage unit with respect to the position information of the received noise. When the deviation of the noise information stored with respect to the position information on the map storage unit is equal to or less than a predetermined level, and the robot moves to the position, the volume control module maps the volume in response to the average value of the stored noise information.

According to an embodiment, a method for controlling a volume in a noise adaptive manner includes exceptional processing sound pressure of a part or all of the noise in consideration of a speech utterance state, a speech receiving state, or a temporal length state of the noise, mapping the volume of the uttered speech in response to the calculated sound pressure of the noise, and controlling the speaker unit to output the sound file to the mapped volume.

Various embodiments may be applied by providing a user with information through the sound or the TTS speech, the exception processing is performed during the calculation of the sound pressure with respect to noise in consideration of the speech utterance state, the speech receiving state, or the temporal length state of noise. Thus, it is possible to output the speech in a noise adaptive manner with respect to the ambient noise.

Various embodiments include the output volume being fixed or the range of changing the output volume can be narrowed during a certain unit of time or unit output to increase the speech recognition rate of the user with respect to the temporal and sound pressure characteristics of noise.

Various embodiments make possible to provide information on a speech utterance state, a speech receiving state, or a temporal length state of a noise, so that the measurement of the noise and the operation thereof can be embodied differently depending on the utterance state of the apparatus or the robot.

These and other embodiments will also become readily apparent to those skilled in the art from the following detailed description of the embodiments having reference to the attached figures, the invention not being limited to any particular embodiment disclosed.

BRIEF DESCRIPTION OF THE DRAWINGS

FIG. 10 shows a sound pressure of noise stored in a map storage unit according to an embodiment of the present invention.

FIG. 11 is a view of timing at which a calculation of sound pressure is performed according to an embodiment of the present invention.

DETAILED DESCRIPTION OF EXEMPLARY EMBODIMENTS

Figure 1:
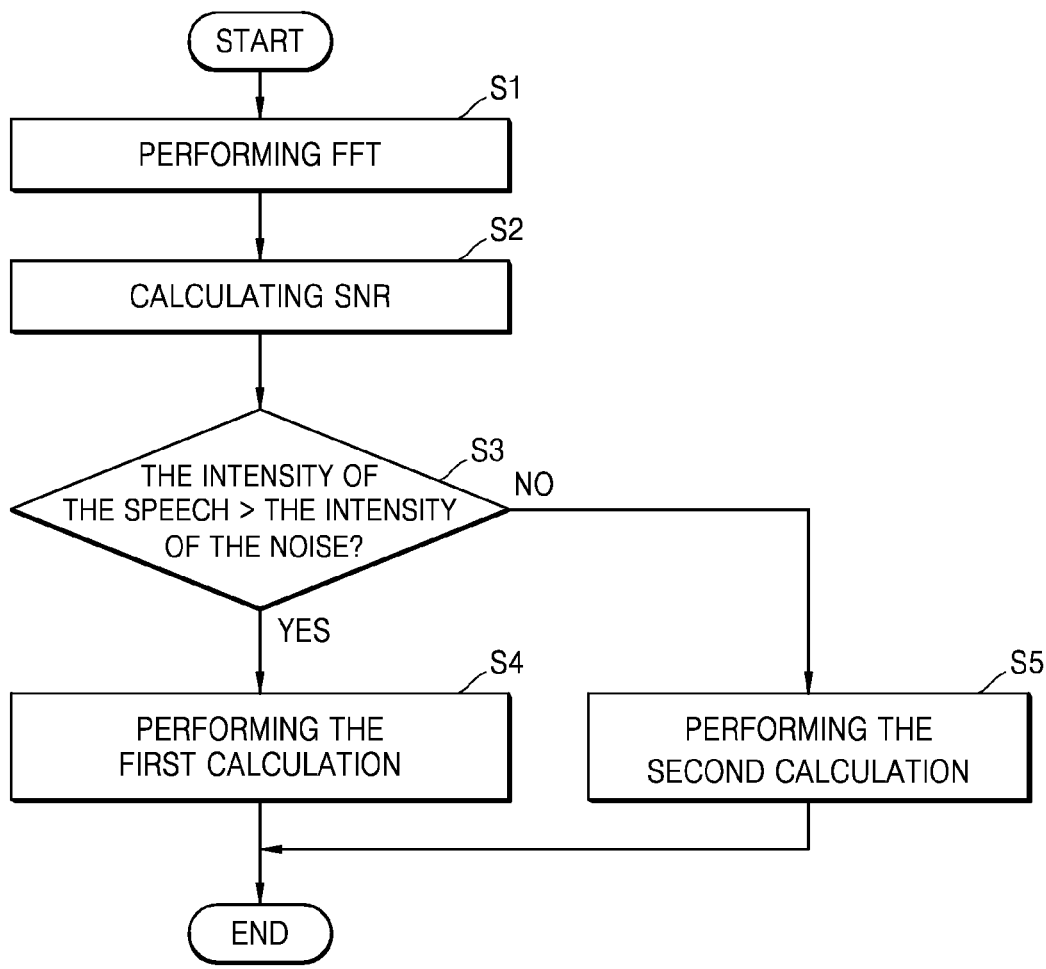
FIG. 1 shows a method for improving correctness of a speech signal according to the related art.

Hereinafter, embodiments of the present invention will be described in detail with reference to the drawings so that those skilled in the art to which this application pertains can easily embody the present invention. The present invention may be embodied in various different manners and is not limited to the embodiment described herein.

In order to clearly illustrate the present invention, a part that is not related to the description may be omitted, and same or similar components are denoted by a same reference numeral throughout the specification. Further, some embodiments in the present invention will be described in detail with reference to exemplary drawings. In adding reference numerals to components of each drawing, the same components may have the same reference numeral even if they are displayed on different drawings. Further, in the description of the present invention, a detailed description of related known configurations and functions will be omitted when it is determined that it may obscure the gist of the present invention.

In the description of components of the present invention, it is possible to use the terms such as the first, the second, A, B, (a), and (b), and the like. These terms are only intended to distinguish a component from another component, and a nature, an order, a sequence, or the number of components, are not limited by that term. When a component is described as being "connected", "coupled", or "connected" to another component, the component may be directly connected or able to be connected to other component; however, it is also to be understood that additional component is "interposed" between the two components, or the two components may be "connected", "coupled", or "connected" through an additional component.

Further, with respect to implementation of the present invention, for convenience of explanation, the invention will be described by subdividing an individual component; however, these components of the invention may be implemented within an apparatus or a module, or a component of the invention may be implemented by being divided into a plurality of apparatuses or modules.

Hereinafter, an apparatus that controls a volume (or a volume control apparatus) may be made solely or may be coupled integrally with a robot having mobility. The robot moves according to an external control or autonomously moves based on information such as a map and provides a predetermined function.

Therefore, the robot includes all the apparatuses that have a specific purpose (cleaning, security, monitoring, guidance, and the like) or provide functions according to the characteristics of a space where the robot moves and moves by the autonomous or external control. Further, the robot is collectively referred to as an apparatus that has a moving means capable of moving by using predetermined information and a sensor, and provides a predetermined function.

Sound pressure level (SPL) refers to the pressure of sound, that is, the level of sound pressure. When the noise is loud, the sensed sound pressure increases. When the noise is small, the sensed sound pressure decreases.

Figure 2:
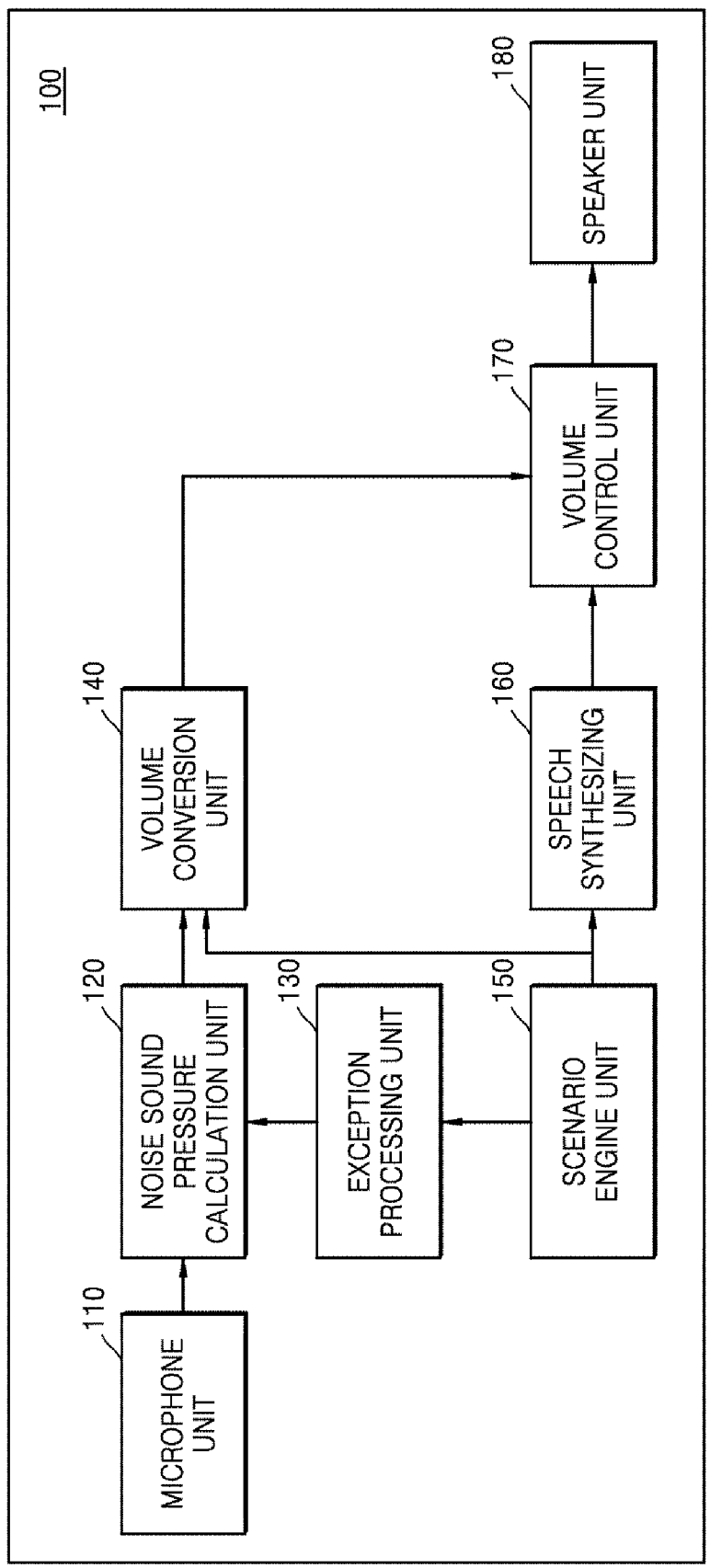
FIG. 2 shows a configuration of a volume control apparatus according to an embodiment of the present invention.

FIG. 2 shows a configuration of a volume control apparatus according to an embodiment of the present invention. The volume control apparatus 100 includes a microphone unit 110, a noise sound pressure calculation unit (a noise SPL calculation unit) 120, an exception processing unit (SPL calculation rejection control unit) 130, a volume conversion unit (SPL-to-volume mapper) 140, a scenario engine unit (UI scenario engine) 150, a sound synthesis unit (TTS player) 160, a volume control unit 170, and a speaker unit 180. Each of these components will now be described.

For example, the microphone unit 110 is provided for speech recognition, and is generally open to supply a received acoustic signal to a system. Noise generated from the outside and speech that a user utters is inputted to the microphone unit 110. The microphone unit 110 picks up external noise and voice of a user. During the input of the noise and the speech, the microphone unit 110 may set a specific sampling rate such as mono/16 kHz/16 bit during sampling. Alternatively, the sampling rate of the microphone unit 110 may be set differently according to the ambient noise.

The noise sound pressure calculation unit 120 calculates sound pressure of noise inputted to the microphone unit 110. The SPL of the noise, that is, the sound pressure is calculated by using the inputted noise signal. The increase in the SPL value is slowly controlled and the decrease in the SPL value is rapidly controlled. This will be described in more detail below.

The exception processing unit 130 instructs the exception processing of the sound pressure of some or all of the noise by using the result calculated by the noise sound pressure calculation unit 120, that is, the calculated result, in consideration of the speech utterance state, the speech receiving state, or the temporal length state of the noise. A state of uttering speech refers to a state where the volume control apparatus 100 utters a predetermined guide phrase and the speaker unit 180 outputs the uttered predetermined guide phrase. A state of receiving speech means a state where a user inputs a command or other sound through speech. A state of the temporal length of noise means magnitude of noise and with a state of time duration. It is possible to increase the volume of the sound outputted by the speaker unit 180 in response to such noise if a certain level of noise continues. On the other hand, if the noise of a very short temporal length is inputted for a time period, the noise can be exceptionally processed and the volume of the speech outputted by the speaker unit 180 can be controlled so that it is not increased.

A further state is where temporary loud noise may be input, or a speech command of a user or a speech guidance of the robot may be detected to stop SPL calculation or to calculate the sound pressure for the received loud sound can be exceptionally processed. Further, the exception processing unit 130 can detect the state information based on a user interface (UI).

The volume conversion unit 140 maps the volume of the uttered speech in response to the sound pressure of the noise calculated by the noise sound pressure calculation unit 120 and the exception processing unit 130. The volume conversion unit 140 maps appropriate volume for the SPL of the noise and converts the mapped appropriate volume. Further, the volume conversion can be stopped during output of the speech guidance. Further, it is possible to sense the output of the guided speech.

The scenario engine unit 150 is a component that controls a UI scenario, and controls the UI. The scenario engine unit 150 provides the exception processing unit 130 with information on the speech utterance state, the speech receiving state, or the temporal length state of the noise. In this process, the speech guidance is outputted and the state of recognizing the speech of the user can be shared with other components.

The sound synthesizing unit 160 synthesizes information on the speech guidance sentence to be outputted by the volume control unit 100 into sound (for example, PCM sound), and the sound control unit 170 adjusts a magnitude of the sound guidance signal to be the numerical value of the target volume. The speech synthesizing unit 160 synthesizes the speech guidance sentence into a sound file of a predetermined format, and the sound file may be stored in advance with respect to the guide sentence, or may be generated in real time. The volume control unit 170 controls the sound file to be outputted to the volume mapped by the speaker unit 180.

The speaker unit 180 amplifies a speech guidance signal and outputs the amplified speech guidance signal. The speaker unit 180 may reflect an amplification factor during the calibration of a mapping function related to an amplification output.

When the volume control apparatus 100 shown in FIG. 2 or a robot or other device equipped with such a control apparatus, guides while moving in an airport, a hotel, a shopping mall, and the like, it is possible to provide the speech guidance of the appropriate volume that can be recognized by a user with respect to a different level of ambient noise everywhere in a moving path within the service area.

The microphone unit 110 of the volume control device 100 measures the level of the ambient noise. Each component of the volume control apparatus 100 obtains a minimum utterance magnitude of the speech guidance and determines the output volume based on logic for measuring only background noise except for a sudden loud noise or speech guidance of the product itself.

Further, the sound pressure conversion unit 140 maps the output volume for each the level of the ambient noise approaching the limits. Further, the speech synthesizing unit 160 and the speaker unit 180 and the like may stop the volume control during the output of the speech for ensuring the recognition of the speech guidance of the user and it is possible to prevent the output volume from being suddenly increased during the utterance of the volume control apparatus 100 or the robot.

Figure 3:
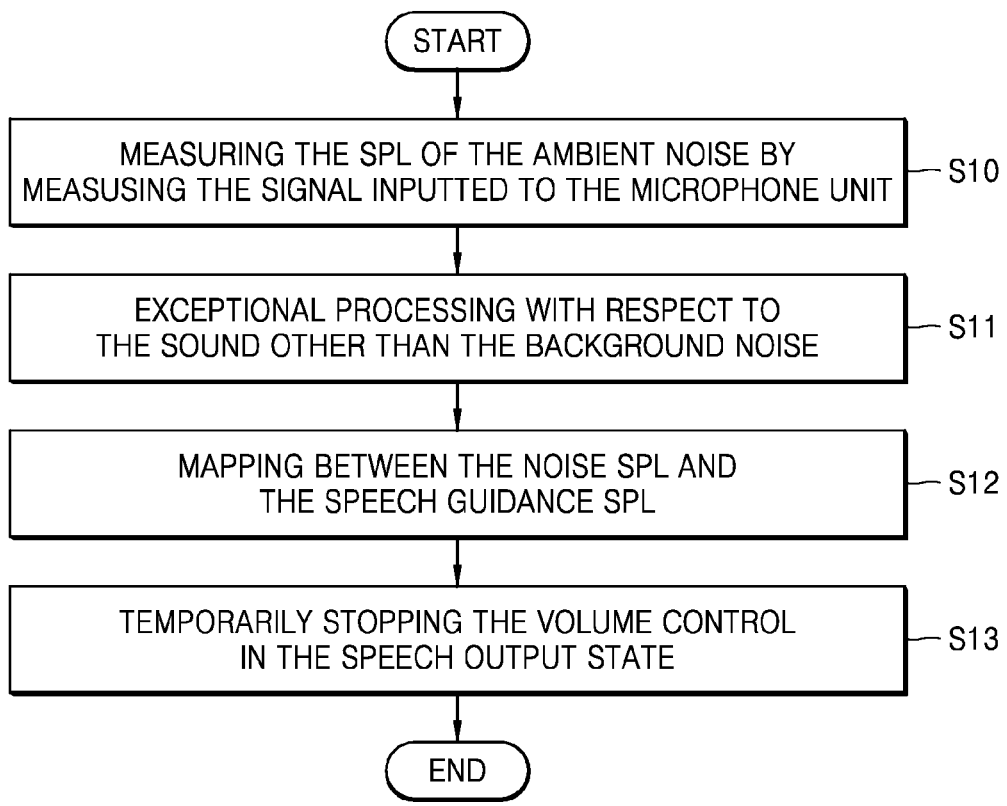
FIG. 3 shows a process in which a volume control apparatus operates according to an embodiment of the present invention.

FIG. 3 shows a process in which a volume control apparatus operates according to an embodiment of the present invention.

A noise sound pressure calculation unit 120 of a volume control apparatus 100 measures a SPL of ambient noise by using a signal inputted to the microphone unit 110 (S10). For example, an A-weight filter is applied to the signal inputted to the microphone, which is included in the volume control apparatus 100 to calculate the SPL in a dB unit.

An exception processing unit 130 performs exception processing for sounds that are not background noise (S11). For example, the exception processing unit 130 may set the background noise to the lowest value among the SPLs to be measured. When a sudden loud sound is inputted to the microphone unit 110 or speech is inputted for a speech recognition command of the user, calculation of background noise may be stopped to eliminate unnecessary errors.

In the calculation of the SPL, the increase in the value is made smoothly and the decrease in the value is made significantly, maximizing a tendency to stay at the lowest value. When the ambient noise maintains a certain level and suddenly becomes large, exception processing is performed to gradually increase the volume of the speech guidance. For example, when the ambient noise suddenly increases and then suddenly decreases again, it is rapidly returned to the volume of original speech guidance.

Figure 4:
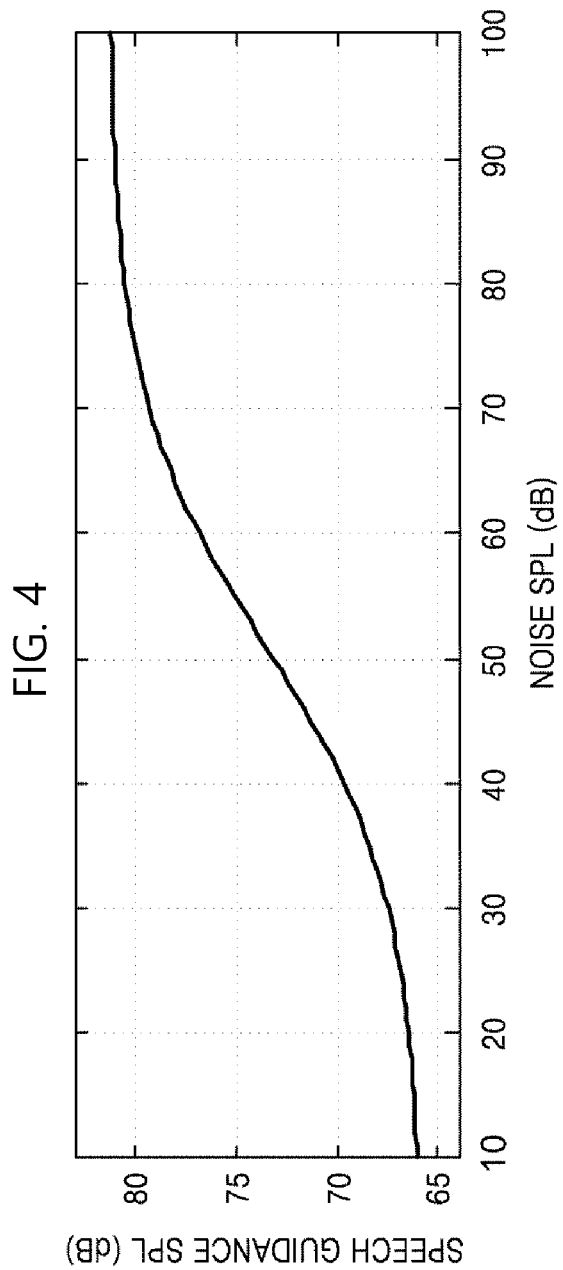
FIG. 4 shows a sigmoid function applied when mapping between noise SPL and speech guidance SPL is made according to an embodiment of the present invention.

The volume conversion unit 140 maps the volume based on the noise SPL and the speech guidance SPL. For example, a sigmoid function can be used as shown in FIG. 4. The volume conversion unit 140 can nonlinearly change the volume of the correct speech guidance expected by the user according to the level of the ambient noise. Such a change can be expressed as the sigmoid function of FIG. 4. In this process, an optimum parameter can be applied by calibrating the position where the volume control device 100 utters and the position where the noise is generated.

Then, in a state where sound is outputted through a speaker unit 180, a volume control depending on external noise is stopped (S13). The function for controlling the volume depending on the external noise of the components of the volume control apparatus 100 is interrupted for a while in the state where the speech is outputted, thereby preventing the volume from being suddenly changed due to the external noise.

The volume control apparatus 100 senses a state of the speech output and temporarily stops the volume control and the volume is not changed during reproduction of the speech guidance, thereby preventing the recognition of the user from being degraded. Therefore, the volume which is controlled at the starting point of outputting a guide speech sentence is maintained until an utterance of the guide speech sentence is ended.

FIG. 4 shows a sigmoid function applied when a mapping between a noise SPL and a speech guidance SPL is made according to an embodiment of the present invention.

In view of the sigmoid function of FIG. 4, when the noise SPL is a certain level (for example, 30 dB or less), the increase in the SPL of the speech guidance is gradually made. For a noise SPL of a certain range (for example, 30 dB to 70 dB), the increase in the SPL of the speech guidance is steeply made. Further, when the noise SPL is a certain level (for example, 70 dB or more), the increase in the SPL of the speech guidance is smoothly made.

In summary, as shown in FIG. 4, the SPL of the noise is divided into two or more sections. In a first section, a slope of speech guidance SPL to the noise SPL may be smoothly increased. In a second section, a slope of speech guidance SPL to the noise SPL may be steeply, increased.

As shown in FIGS. 2 to 4, the volume control apparatus 100 or a robot equipped with such an apparatus senses the correct noise SPL inputted to the microphone unit 110, thereby minimizing an influence of sound other than background noise. As a result, it is possible to meet expected volume of the speech guidance from a viewpoint of a customer and prevent an unnecessary change of volume from being generated during listening of the speech guidance.

In particular, the volume control apparatus 100 or the robot equipped with the volume control apparatus 100 can determine an exception state based on a certain unit (one or more sentences, a word, and the like) during the utterance of the speech guidance. Accordingly, during the speech guidance of one unit, the volume control device 100 may determine the current state as an exception state, and stop the control for increasing volume of the guidance speech with regard to the ambient noise.

Further, when a time point at which the speech guidance starts (at a time point of utterance) is stored in the volume control apparatus 100 or the robot equipped with the volume control apparatus 100 or is predicted therefrom, the function for changing the volume of the uttered speech in response to the SPL of the ambient noise based on the time information can be on/off.

As shown in FIGS. 2 to 4, the volume control apparatus 100 may be mounted on the robot as a module. In the case of a mobile robot, the volume control apparatus 100 may control the output volume in an adaptive manner to external noise to improve the recognition ratio of the speech guidance.

As a result, it is possible to solve the problem in which the user cannot confirm the contents of the speech guidance as the volume of the robot is suddenly increased by controlling the speech guidance to the volume suitable for the user to be recognized in response to the level of the ambient noise which varies according to the position of the mobile robot. Of course, such embodiments are not necessarily applied to a mobile robot, and may be applied to a case where a command of the user is inputted when the robot is fixed. In addition, various embodiments are discussed with reference to a robot, but such teachings apply similarly to other devices and systems.

Figure 5:
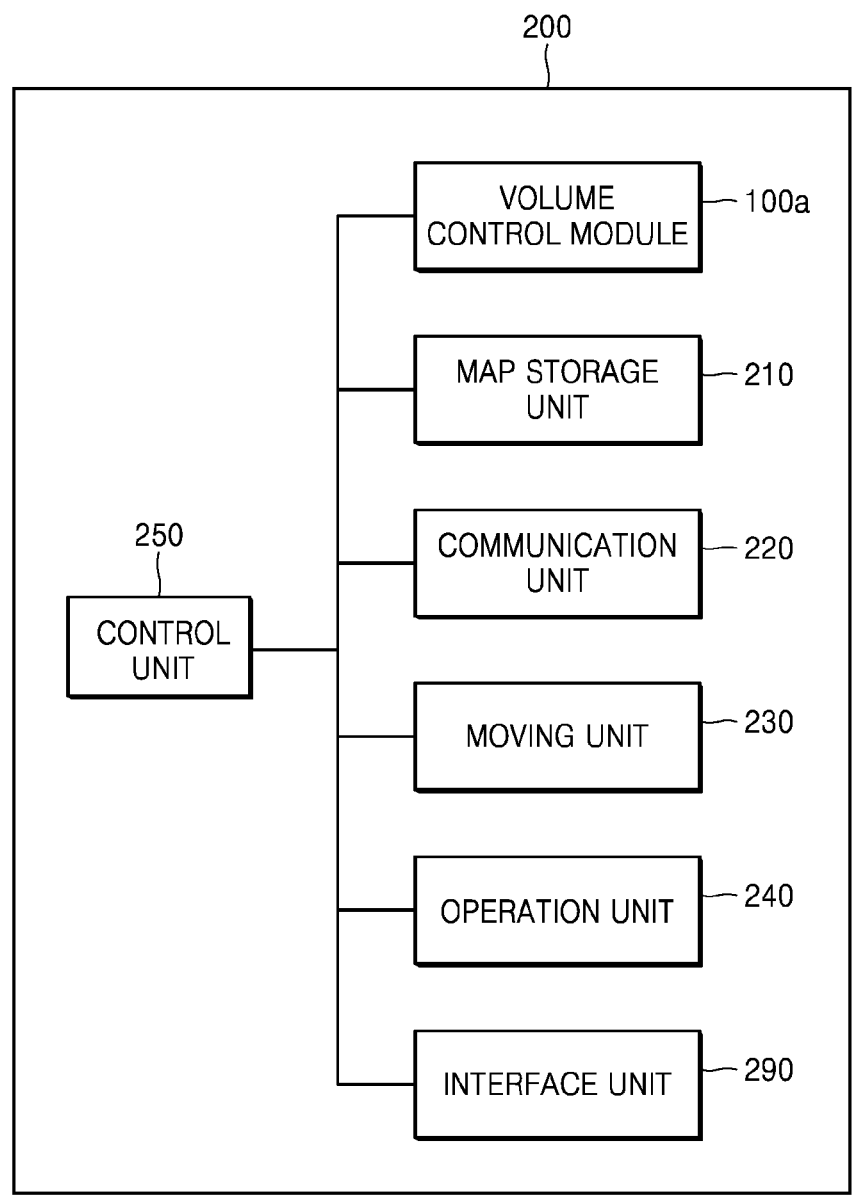
FIG. 5 shows a configuration of a robot 200 according to an embodiment of the present invention.

FIG. 5 shows a robot 200 according to an embodiment of the present invention. In the robot of FIG. 5, the volume control apparatus shown in FIG. 2 is mounted in a volume control module 100*a*.

The configuration and the operation of the volume control module 100*a* are generally the same as shown in FIGS. 2 to 4.

A map storage unit 210 stores noise information of a space that a robot travels. It is possible to store the magnitude of the noise received at a specific location or at a specific time in the location. The suddenly increased noise can be excluded.

A communication unit 220 is a component for a robot 200 to exchange information with another robot or a server.

A moving unit 230 is a component that moves a robot and includes various types of mechanical components that move the robot such as a wheel or a caterpillar.

An operation unit 240 performs a specific function set in the robot. Specific functions include various functions such as cleaning, security, guidance, and baggage delivery, and the like.

A control unit 250 controls a volume control module 100*a*, a map storage unit 210, a moving unit 230, and an operation unit 240.

An interface unit 290 may be selectively included in the robot, and a speaker unit 180 of the volume control module 100*a* may be arranged in the interface unit 290 to output sounds to the outside. Alternatively, a display unit that outputs visual information such as characters or light may be arranged in the interface unit 290.

The speech guidance is controlled at appropriate volume suitable for being recognized with respect to the level of the ambient noise that varies for each position that the robot 200 moves, and thereby recognition rate of the speech guidance of the user may be increased. For example, the volume control module 100*a* may stop the background noise calculation when sudden loud sound is inputted during the measurement of the background noise, or when speech for the command of the user with respect to the speech recognition is inputted. In the measurement of background noise, the increase in the value can be made smoothly, and the decrease in the value can be made significantly so as to gradually match the increase of the noise.

Further, it is possible to nonlinearly map the magnitude of volume of the speech guidance to the level of the background noise. For example, the sigmoid function of FIG. 4 can be applied. During the reproduction of the speech guidance, the volume control is temporarily stopped to solve a problem that the sound of the speech guidance suddenly increases due to the sudden noise.

The speech guidance volume is set to the lowest energy based on the background noise that is inputted, thereby being suitable for tracking. The volume control of the volume is performed in a minimum unit, for example, a sentence unit, so that the volume up does not occur suddenly. The volume can be adjusted for each sentence unit, or if there is a certain speech pause period in the sentence the case of a composite sentence), the volume can be adjusted based on the speech pause period.

Figure 6:
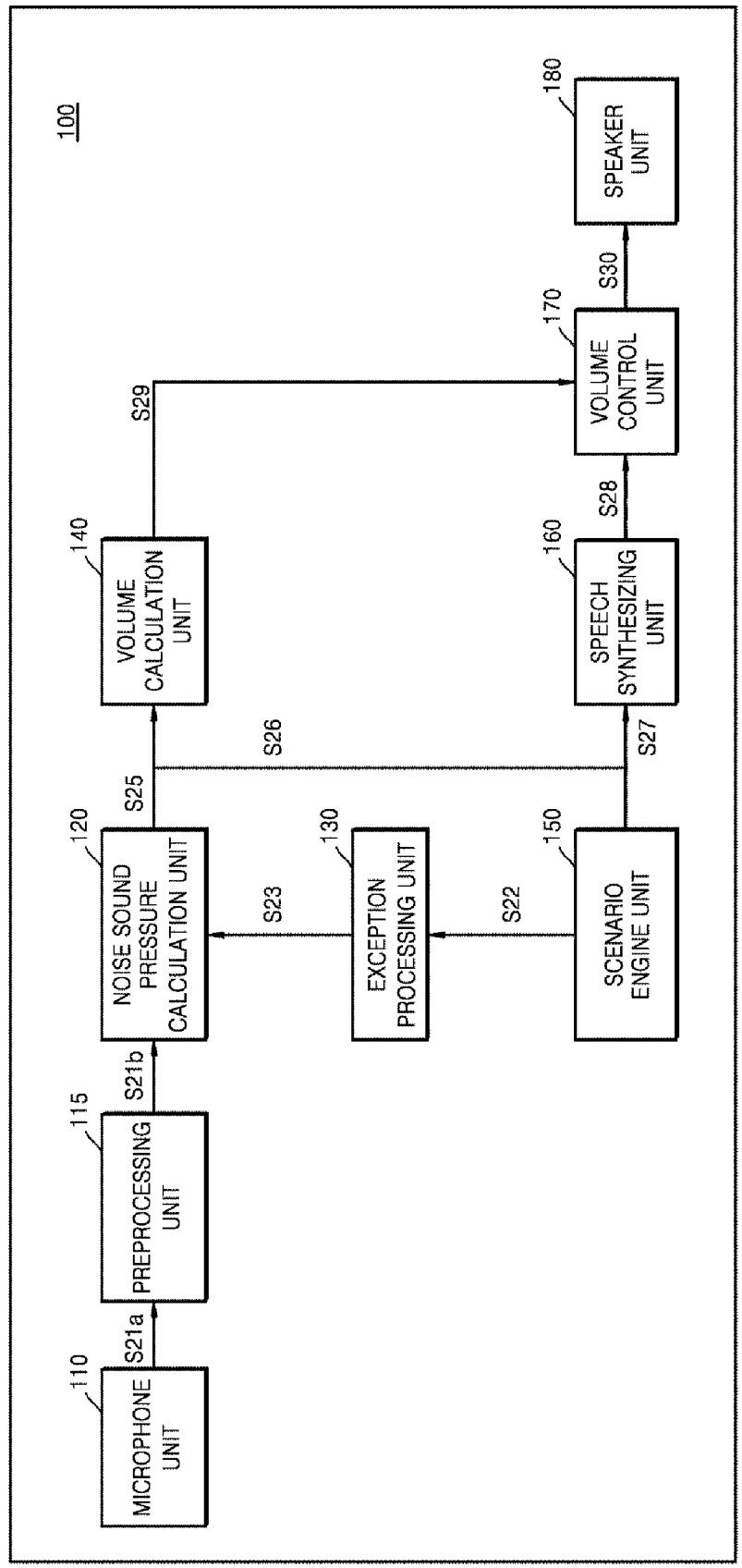
FIG. 6 shows an interaction between components according to an embodiment of the present invention.

FIG. 6 shows an interaction between the components according to an embodiment of the present invention. It will be described with reference to FIGS. 2 and 5.

Noise is inputted to a microphone unit 110 from an outside and the microphone unit 110 provides a noise sound pressure calculation unit 120 with the inputted noise (S21*a*, S21*b*). In this process, before the microphone unit 110 provides the noise sound pressure calculation unit 120 with the noise, the noise is provided to a preprocessing unit 115 (S21a), and the preprocessing unit 115 may apply a correction filter for precise calculation of the sound pressure of the noise to provide the noise sound pressure calculation unit 120 with the corrected noise (S21b).

The preprocessing unit 115 compensates the frequency characteristic of a microphone so that the sound pressure can be precisely measured. For example, background noise is only selected by analyzing a microphone signal and the SPL is precisely calculated in a dB unit. Further, it is possible to precisely measure the sound pressure by compensating the frequency band of the inputted microphone with an A-weight frequency response curve method.

The noise sound pressure calculation unit 120 performs the signal processing with respect to the result that the preprocessing unit 115 corrects to calculate the SPL of the noise level.

The noise sound pressure calculation unit 120 precisely calculates the SPL of the noise level through the signal processing. For example, the level of the signal can be confirmed by using an analog VU meter (volume unit). An audio input can be rectified by using a diode and a capacitor can be used to adjust a rising/falling time to display power of the voltage rectified on a VU meter as a log-scale ($\log_{10}(x^2)$). The SPL of the noise can be calculated by using the log scale shown. In this process, the sound pressure of the noise of a meaningful range (dB) may be extracted, and the noise sound pressure calculation unit 120 determines the extracted sound pressure of the noise as the sound pressure of the noise.

Meanwhile, during the calculation of the noise through the noise sound pressure calculation unit 120, an exception processing unit 130 can instruct the exception processing with respect to the sound other than the background noise (S23). With respect to the information required for the exception processing unit 130 to instruct the exception processing, a scenario engine unit 150 can provide state information to the exception processing unit 130.

The state information provided by the scenario engine unit 150 to the exception processing unit 130 may be a speech utterance state (TTS active state), a speech receiving state (VR active state and KA result state). The speech utterance state refers to a state where the robot utters a guide phrase through text to speech (TTS) or outputs previously stored sound.

Two states of receiving speech may be provided. The KA result state (keyword activation result state) means a state where a start-up word is inputted to notify that the user inputs a predetermined command to the robot or the volume control apparatus. When the start-up word is inputted, it is in a state of waiting for the speech input. VR active state (voice record state or voice recognition state) means a state where speech of the user is inputted.

The scenario engine unit 150 notifies the exception processing unit 130 of a state of the current utterance or a state where it waits for the speech input or the speech is inputted (S23). Further, when the temporal length of the inputted noise is equal to or lower than a predetermined level, the exception processing unit 130 may instruct the noise sound pressure calculation unit 120 to perform the exception processing during calculation of noise sound pressure with respect to instantaneous noise (S23).

The noise sound pressure calculation unit 120 calculates the SPL (sound pressure level) of the noise calculated by the scenario engine unit 150 and the exception processing unit 150 in a dB unit and provides the calculated SPL to the volume conversion unit 140 (S25). Further, in this process, the scenario engine unit 150 may provide the volume conversion unit 140 with information on a current utterance state of an apparatus or a robot or a message to be uttered (S26).

In more detail, in S26, it is possible to indicate whether sound to be outputted is a TTS event message or a file play event message that reproduces a previously stored file. Accordingly, the volume can be calculated differently.

A volume conversion unit 140 sets the volume of a guide phrase to be outputted by using a level of the sound pressure of the noise and the information on the current state provided by a scenario engine unit 150. As described above, the volume suitable for the current noise level can be calculated by calibrating a SPL value that a robot utters by the sigmoid function as shown in FIG. 4, which is expected according to the sound pressure level (SPL) of the background noise.

On the other hand, a speech synthesizing unit 160 also converts a guide phrase provided by the scenario engine unit 150 into a speech file (S27). The generated speech file (TTS file), for example, a PCM file is provided to a volume control unit 170 (S28), and the volume conversion unit 140 provides the set volume to the volume control unit 170 (S29). As a result, the volume control unit 170 provides the sound file to be outputted and the volume set by using the information provided in S28 and S29 to the speaker unit 180, and the speaker unit 180 outputs the sound file.

The volume control unit 170 may set the volume to the calculated volume value for the file play event message and perform post-processing to improve the correctness of the speech with respect to the TTS event message. Depending on the type of sound to be outputted, with respect to the TTS, the post-processing can be performed so that the user can correctly recognize the speech. On the other hand, in the file play event message that is the reproduction of the stored sound file, the system volume can be set according to the sound pressure level of the noise.

Based on the configuration and the process of FIG. 6, the volume control apparatus or the robot equipped with the volume control apparatus continuously measures the noise and exceptionally process the noise measurement in an exception state (such as when a robot utters or reproduces specific sound, or it waits for speech input of a user or the speech is inputted).

The exception processing can be made with respect to loud noise generated in a short period of time (for example, short and loud noises within 2 seconds). When the sound pressure of the noise is calculated, a small weight is set, and an importance with respect to the short and loud noise can be set lower in the calculation of the sound pressure of the noise.

Figure 7:
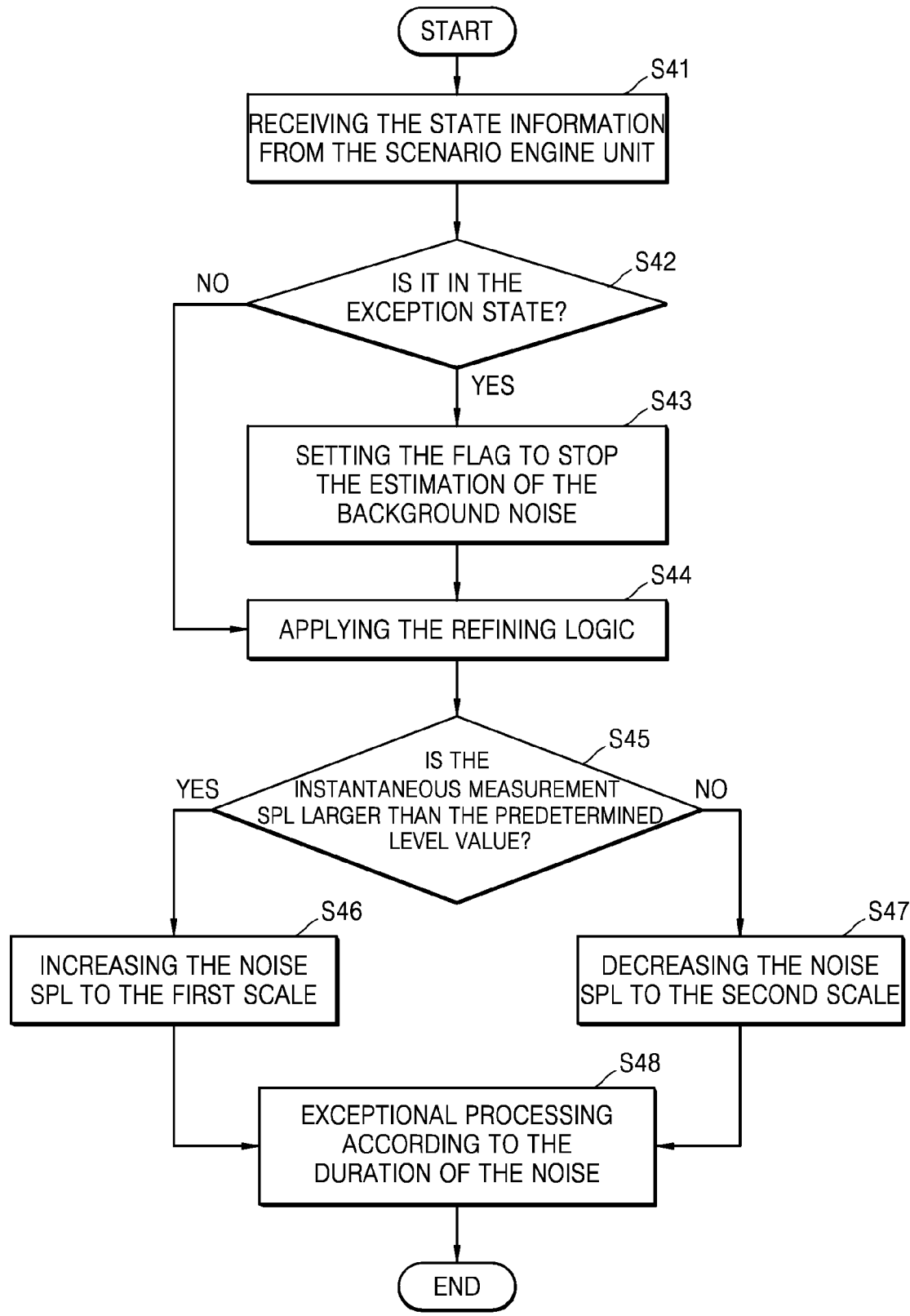
FIG. 7 shows a process in which an exception processing unit instructs exception processing of a sound pressure level of noise according to an embodiment of the present invention.

FIG. 7 shows a process in which an exception processing unit instructs exception processing of a sound pressure level of noise according to an embodiment of the present invention. According to FIG. 7, the process performs the exception processing with respect to sound other than background noise. For example, an exception state of estimating noise is an utterance of a robot, a speech command, and loud sound in a short interval.

An exception processing unit 130 receives state information from a scenario engine unit 150 (S41). The state information may be a state where an apparatus or a robot utters (speech guidance, notification sound, escort music), a speech command (keyword recognition, and speech of the customer during speech recognition).

The exception processing unit 130 identifies whether a current state is in an exception state (S42), and sets a flag to stop the estimation of the background noise (S43). This flag instructs the noise sound pressure calculation unit 120 not to calculate the sound pressure for the background noise.

The scenario engine unit 150 identifies whether the robot is in an utterance state (a state where TTS is outputted or particular sound file is reproduced) or the robot is in a state of receiving the speech command (keyword activation, voice recognition) and transmits the state information to the exception processing unit 130.

Thereafter, the exception processing unit 130 continuously identifies the state during the certain period (for example, a short period, for example, 0.2 seconds and 0.3 seconds) to monitor whether the exception state is generated or such a state is resolved. If a value of a flag is adjusted so that a noise sound pressure calculation unit 120 refers, the noise sound pressure calculation unit 120 may calculate or not calculate the sound pressure for the background noise according to the change of the flag value.

In the case of a speech utterance state and text to speech (TTS) output, the exception processing unit 130 may instruct the exception processing on the basis of a minimum unit of a notice to be uttered. The minimum unit can be a sentence. Therefore, the exception processing is made while a sentence is outputted through speech, and the sound pressure of the background noise can be measured when there is a time interval before the next sentence is outputted. At a time point at which the next sentence is outputted, the sound pressure of the background noise can be measured by making the exception processing again.

In this case, even when loud sound is generated during the output of one sentence through speech, it is possible to output sound at constant volume so that the volume is not changed.

The exception processing unit 130 may instruct the exception processing during a time of waiting for the speech utterance when a start-up word is inputted to the microphone unit 100. When a start-up word (keyword) is inputted, the user can make a speech command thereafter, so that the processing of the background noise can be stopped.

Refining logic is applied after processing an exception state (S44). For example, it is a counter based logic for rejecting an influence of an onset at the beginning of a loud speech in a short interval or keyword recognition.

The exception processing unit 130 additionally manages the preset level sound pressure value. When an instantaneously measured sound pressure (an instantaneously measured SPL) is greater than a preset level sound pressure (S45), the noise SPL is increased to the first scale (S46). On the other hand, when the instantaneously measured sound pressure (instantaneous measurement SPL) is smaller than the preset level sound pressure (S45), the noise SPL is reduced to a second scale (S47). The absolute value of the first scale is smaller than that of the second scale. For example, the first scale is 0.0005 dB and the second scale is 0.01 dB. The absolute value of the second scale can be set greater than that of the first scale.

In S46 and S47, in the application of the SPL value of the measured noise to the SPL of the background noise, an onset process for the increase is slowed down and the offset process for the decrease is accelerated to calculate the SPL only for the actual background noise.

Further, the exception processing is performed according to the duration of noise (S48). The noise generated for a short period of time can be excluded in the calculation of the sound pressure of the background noise, thereby it is possible to prevent the output volume of the robot from being excessively increased. With respect to the loud sound or voice in the short interval, the time can be measured by using a delay time counter in order to stop the influence on the onset for the application to the noise SPL or reduce such an influence, or remove such an influence.

For example, when an SPL measurement value of noise exceeding a preset level of sound pressure by a predetermined magnitude (for example, 6 dB) is confirmed, the duration of the noise is counted in a sample unit of 2 seconds in a state where a rate of reflecting onset is slowed down to a 0.00002 dB. When the measurement value of the SPL exceeding the level of the sound pressure by a predetermined magnitude (for example, 6 dB), the reflection rate of the onset is set to 6 dB and the level of the sound pressure can be increased to the measured SPL level.

In summary, the noise that lasts a certain reference time (for example, 2 seconds) or less by counting the duration of the noise is excluded in the calculation of the sound pressure of the background noise or the noise that lasts a certain reference time (for example, 2 seconds) or less is reduced to very small magnitude and calculated. On the other hand, for the noise that lasts a certain period of time or more, the sound pressure of the background noise is calculated and the sound pressure of the level of the noise can be increased by predicting that such noise continuously lasts.

By an example of FIG. 7 being applied, the exception processing may be performed so that e sound pressure of the noise inputted to the microphone unit 110 may not be calculated at all, or the sound pressure of the sound may be calculated by reducing to the preset ratio. For example, when the measured sound pressure of the noise is large as exemplified in S44 to S48 according to the refining logic, the sound pressure of the noise is increased by a small unit (S46). If the noise is reduced, the sound pressure of the noise is decreased by a large unit (S47).

Figure 8:
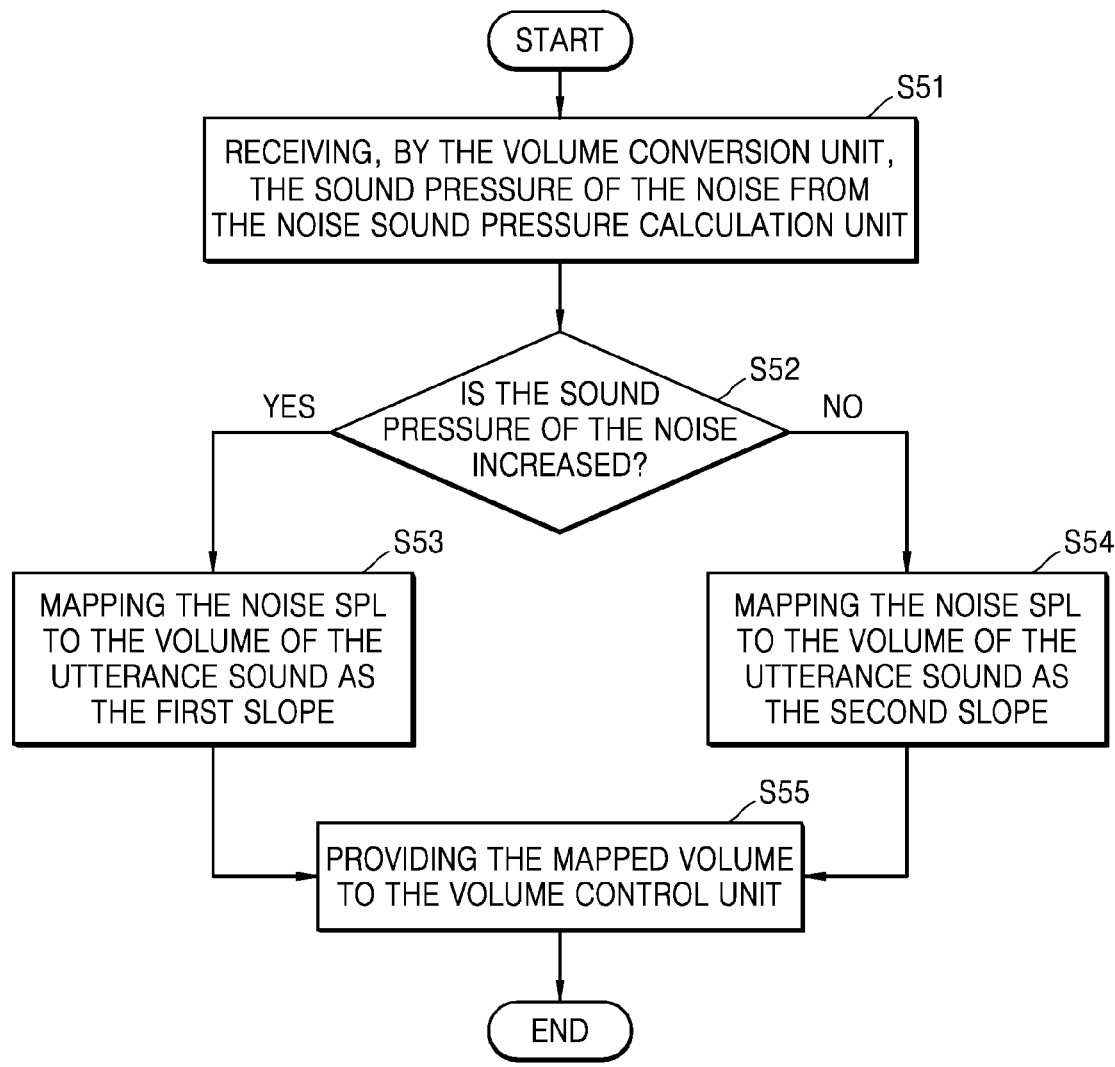
FIG. 8 shows a process in which a volume conversion unit converts volume according to an embodiment of the present invention.

FIG. 8 shows a process in which a volume conversion unit converts volume according to an embodiment of the present invention.

A volume conversion unit 140 receives the sound pressure of the noise from a noise sound pressure calculation unit 120 (S51). Then, it is identified whether the sound pressure of the noise is increased or not (S52). In response to the increase in the sound pressure of the noise, volume of the uttered sound is mapped as a first slope (S53). If the sound pressure of the noise is not increased, the volume of the uttered speech is mapped as a second slope in response to the decrease in the sound pressure of the noise (S54). The absolute value of the first slope is set to be smaller than that of the second slope. For example, even if the sound pressure of the noise increases, the volume of the uttered speech is mapped with a small increase rate (the first slope). When the sound pressure of the noise decreases, the volume of the uttered speech is mapped with a larger decrease rate (the second slope). The mapped volume is provided to the volume provision unit 170, and the robot outputs speech or media files with the controlled volume.

Alternatively, even when the noise of S53 is increased, the volume can be mapped differently. For example, by applying the sigmoid function of FIG. 4, the sound pressure section of the noise can be divided into three sections, which is set sequentially from the smallest sound pressure section, for example, a first section (for example, 30 dB), a second section (for example, 30 dB to 70 dB), and a third section (for example, 70 dB). The sound pressure of the second section is larger than the sound pressure of the first section, and the sound pressure of the third section is larger than the sound pressure of the second section.

The volume conversion unit 140 maps the volume to increase as the first slope in response to the sound pressure of the sound calculated when the calculated sound pressure of noise belongs to the first section, and maps the volume to be increased as the second slope in response to the calculated sound pressure of the noise when the calculated sound pressure of the noise belongs to the second section, and maps the volume to be increased in the third slope in response to the calculated sound pressure of the noise when the calculated sound pressure of the noise belongs to the third section.

The second slope has a value larger than the first slope and the third slope. For example, the volume conversion unit 140 maps the volume as a slow slope (that is, with a small increasing rate) with respect to the sound pressure of the noise in the first section and the third section, and maps the volume in the steep slope (that is, with a large increasing rate) with respect to the sound pressure of the noise in the second section. As described above, when the sound pressure of the noise is divided into two or more sections and different increase ratios (different slopes) are applied, respectively, the system volume is controlled to be suitable for the measured background noise SPL so that the speech or the type of the reproducing file can be recognized from the viewpoint of a user. For example, a proportion for each section is applied to the volume magnitude of the speech guidance expected for each sound pressure section of the noise, instead of a constant proportion.

Of course, the sound pressure of the noise can be divided into two sections, instead of three sections. The volume may be mapped so as to increase with a small magnitude in the first section (small sound pressure band) and the volume may be mapped so as to increase with a large magnitude in the second section (large sound pressure band).

In summary, the volume conversion unit 140 can apply the sigmoid function when the volume to be mapped is calculated in response to the sound pressure of the noise.

The volume conversion unit 140 may use the above-mentioned sigmoid function FIG. 4 in the mapping of the volume in response to the noise, and may use Equation 1 that embodies the above.

$$L_{TTS} = \text{Var}1 \cdot \frac{1}{\text{Var}5 + e^{\text{Var}3 \cdot (L_{Noise} + \text{Var}4)}} + \text{Var}2 \qquad \text{Equation 1}$$

In Equation 1, Var1 is selected in accordance with the gain value of the output speech with respect to the sound pressure of the inputted noise. Var2 means an absolute volume, i.e., a value of level of volume of guide speech that has to be obtained.

Var3 is a curvature of a sigmoid function and Var4 is a variable for compensating an output during measurement of external noise. For example, when Var1 is a positive number, Var3 is a negative number. Var5 is also a variable required when the sound pressure of the noise and the volume of the TTS speech are mapped in the implementation of the sigmoid function.

The various variables of Equation 1 can be variously selected according to the environment where the robot or the volume control apparatus operates, or the type of speech guidance to be outputted, and the like.

When Equation 1 is applied, with respect to the system volume, the SPL of the noise can be measured in a specific unit (for example, 1% unit) and a logarithmic function can be set. Then, an inverse function can be calculated and the target volume V for the required SPL of the TTS speech can be set as shown in Equation 2.

$$V = 10^{(L_{TTS} + \text{Var}6)/\text{Var}7} (\%) \qquad \text{Equation 2:}$$

According to another embodiment of the present invention, the robot equipped with a volume control module 100a stores the sound pressure of the noise in the map storage unit, and when the level of the sound pressure is constant, it corresponds to the sound pressure of the noise at the position. For example, the entire space can be divided into cells of a certain size (for example, 1 m of width and 1 in of height), and the sound pressure of the background noise measured for each of the cell divided can be stored. The sound pressure of the background noise can be stored each time the robot moves and the stored results are collected and calculated so as to be stored as sound pressure of basic background noise that may occur in the space.

In particular, when the deviation of the stored noise information is equal to or less than predetermined level, the control unit 250 of the robot 200 determines that the noise in the space is constant and can set noise information for the cell. Then, the robot moves to the space, and the level of the background noise, which is a level in the noise measurement, can be based on the sound pressure of the noise of the previously stored cell.

Figure 9:
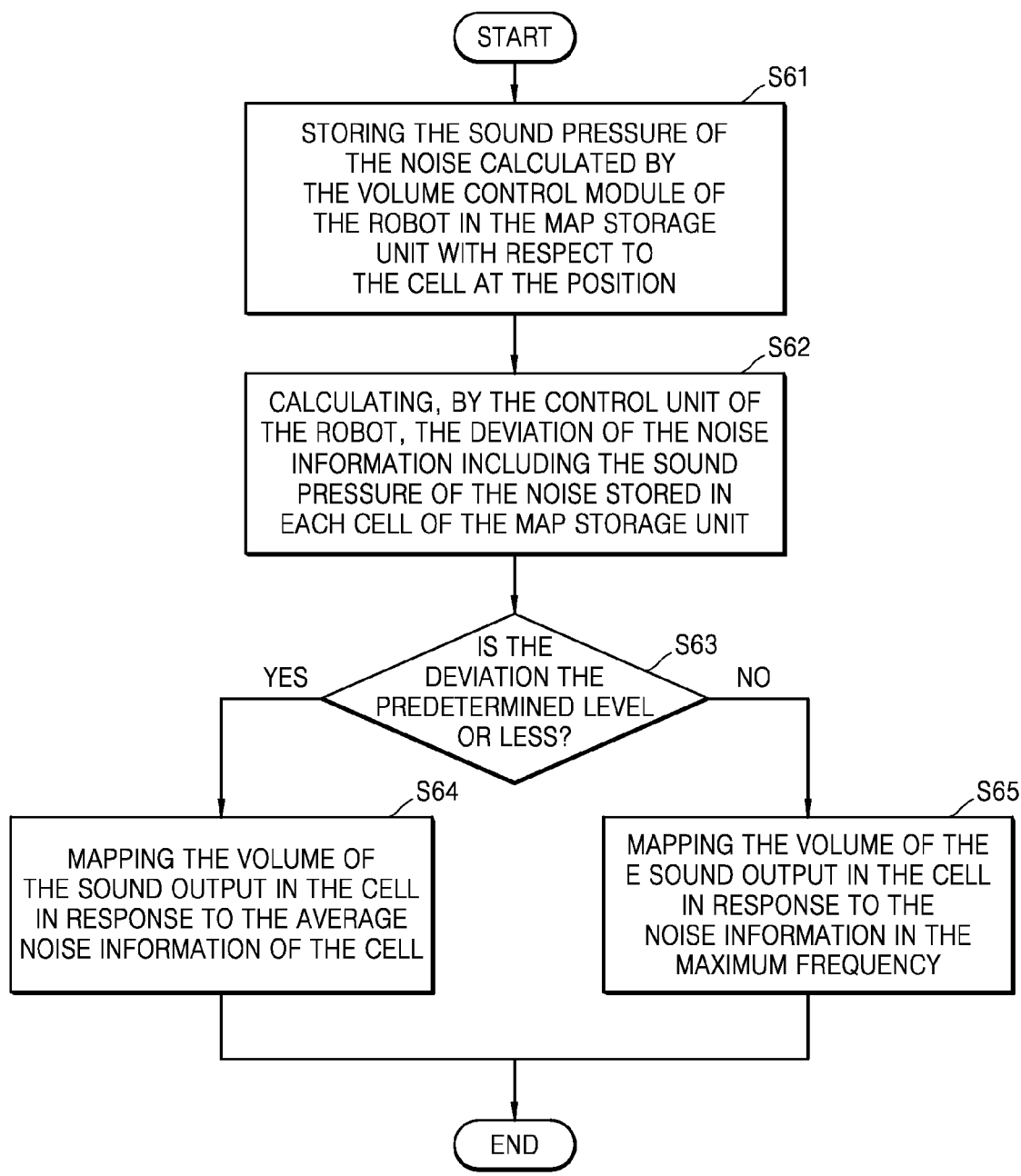
FIG. 9 shows a process of storing sound pressure of noise generated in each space obtained during the movement of the robot for each position and using the stored sound pressure of noise according to an embodiment of the present invention.

FIG. 9 shows a process of storing sound pressure of noise generated in each space obtained during a movement of a robot and using the stored sound pressure according to an embodiment of the present invention.

A control unit 250 collectively stores sound pressure of noise calculated by a noise sound pressure calculation unit 120 of a volume control module 100a to a map storage unit 210 as noise information, with respect to position information on the received noise cell in the position) (S61). A control unit of the robot calculates position information of the map storage unit, that is, the deviation of noise information stored with respect to each cell (S62).

In this process, the noise information can be grouped for each cell and time to calculate a deviation. After the calculation of the deviation, when the deviation is a predetermined level or less (S63) and the robot moves to the position, the volume conversion unit 140 of the robot maps the volume of the speech output in the cell in response to the average noise information on the cell (S64).

On the other hand, when the standard deviation is a predetermined level or more, the volume of the speech output in the cell is mapped in response to the noise information generated at the maximum frequency (S65). If there is a large difference in the sound pressure values of the noise, instead of the maximum frequency, it is possible to calculate the average except a largest value and a smallest value.

When the robot moves to the position, the volume conversion unit 140 of the volume control module 100a maps the volume in response to the average value or the maximum frequency value of the stored noise information.

Alternatively, when the difference between the noise information at the position and the sound pressure of the noise calculated by the noise sound pressure calculation unit 120 is equal to or less than a predetermined level, it may be noise that may generally occur at the position. The exception processing unit 130 may not instruct the exception processing to the noise sound pressure calculation unit 120.

FIG. 10 shows sound pressure of noise stored in a map storage unit according to an embodiment of the present invention. The position (Pos) shows a (x, y) position of each cell of the map storage unit. The size of the cell can be variously determined according to the size or movement speed of the robot.

The values of the sound pressure at the respective positions at a first time point (Time 1) to a fifth time point (Time 5) are stored. Deviation shows the deviation of the sound pressure of noise at each position. The standard deviation at Pos (1, 1) is 1.2 and the standard deviation at Pos (3, 5) is 7.6, and the standard deviation at Pos (7, 2) is 7.28. Therefore, when the robot moves to the position of Pos (1, 1), it is possible to set the average value of the sound pressure of the noise at the position to 31 and map the volume in response to the average value.

Alternatively, since Pos (3, 5) has a large deviation, it is possible to select an median value or a maximum frequency value. Alternatively, the average value 33 of the remaining measurement values excluding the largest value 51 and the smallest value 15 can be set as the sound pressure of the noise at the position, and the volume can be mapped in response to the median value, the maximum frequency value, or the average value excluding largest/smallest value.

Further, when the difference between the noise information at the position and the actually measured noise sound pressure is a predetermined level or less, the exception processing unit 130 determines it as general background noise and does not instruct the noise sound pressure calculation unit to perform additional exception processing.

FIG. 11 is a view of timing at which calculation of sound pressure is made according to an embodiment of the present invention.

For example, in FIG. 11, a sound outputted through a speaker unit 180, for example, TTS is represented as TTS (SPK) and described; however, it is also applied to an output of various sound files outputted by a robot or a volume control apparatus. A command of the user and ambient noise are inputted to a microphone unit (MIC) 110.

When ambient noise is continuously inputted to the microphone unit (MIC) (S70), a noise sound pressure calculation unit 120 measures noise and calculates sound pressure level of the noise (Noise SPL Cal) (S71). In this process, a start-up word (keyword) is inputted to a microphone unit 110 (S72). The user pronounces a specific command (for example, "air star") to the robot and the pronounced command is inputted to the microphone unit 110 and the keyword is confirmed.

A scenario engine unit 150 notifies an exception processing unit 130 that a current state is a KA state as the keyword is inputted (S22 of FIG. 6) and the exception processing unit 130 instructs the exception processing to the noise sound pressure calculation unit 120 and no longer calculates the sound pressure of the noise.

The volume conversion unit 140 calculates volume of TTS speech to be outputted according to the sound pressure level of the noise calculated in step S71 (noise inputted to a microphone unit in step S70). A speaker unit (SPK) 180 outputs the guide message with respect to a start-up word according to processing of a speech synthesizing unit 160 and a volume control unit 170.

The speech guidance message outputted in S73 is outputted to the volume mapped to the sound pressure level of the noise calculated in S71 (the noise inputted to the microphone unit in S70). If loud sound suddenly occurs after S71, the loud sound is not reflected to the speech guidance of S73. Further, in the measurement of the sound pressure level of the noise in S71, it is possible to exceptionally process the noise temporarily largely generated.

In S73, when a specific guidance message ("please press the microphone button or say it") is outputted, it is in a state of waiting for speech recognition. The scenario engine unit 150 notifies that this state is a VR state to the exception processing unit 130 (S22 in FIG. 6), and the exception processing unit 130 instructs the exception processing to the noise sound pressure calculation unit 120 not to calculate the sound pressure of the noise.

If the user inputs the inquiring matter ("baggage storage") as exemplified in S74 through speech, the robot process it as the TTS as exemplified in S75 ("go straight and turn left"). When the TTS output is completed in a specific unit, the microphone unit MIC continuously receives the ambient noise (S77), and the noise sound pressure calculation unit 120 measures the noise to calculate the sound pressure level of the noise (Noise SPL Cal) (S76). The subsequent steps are repeated as described above.

In summary, in the scenario shown in FIG. 11, the robot or the volume control apparatus determines the volume of the sound to be outputted by using the SPL of the noise calculated in S71. In this process, the suddenly increased noise in S71 may be reflected in the calculation of the SPL of the noise at a small rate or may be excluded, as the suddenly increased and disappearing noise is a temporary phenomenon and is irrelevant to volume of output sound.

Although all components are described by being included in the embodiment of the present invention are combined to one, or by being combined to be operated as one component, the present invention is not necessarily limited to this embodiment, and all components can be selectively combined to one or more and operated within the purpose range of the present invention. Further, although all of the components may be implemented as an independent apparatus, a part or all of the components may be selectively combined to form a plurality of apparatuses and a part of the components may be implemented as a computer program that has a program module to perform a part of all of functions by a processor, for example. The codes and the code segments that are included in the computer program may be easily deduced by those skilled in the art of the present invention. The computer program may be stored in a computer readable medium that a computer can read, and the computer program may be read and implemented by the computer so as to implement the embodiment of the present invention. The storage medium of the computer program may include a storage medium including a semiconductor recording element, an optical recording medium, a magnetic recording medium. Further, the computer program that implements the embodiment of the invention includes a program module that is transmitted in real time through an external device. For instance, various units and modules depicted in the figures may be separately or collectively implemented in hardware (e.g., processor, controller, etc.), software, and combinations thereof.

While the present invention has been mainly described referring to the embodiment of the present invention hereinabove, various modifications and changes can be made at the level of those skilled in the art. Therefore, unless such a modification and change do not deviate the range of the present invention, it will understand that they are included in the scope of the present invention.

What is claimed is:

1. An apparatus, comprising:
   a speaker;
   a microphone configured to receive external noise and speech of a user;
   a noise sound pressure calculator configured to calculate sound pressure of the noise received by the microphone;
   a processor configured to perform exception processing of the sound pressure of some or all of the noise using the calculated sound pressure and one of a speech utterance state, a speech receiving state, or a temporal length state, of the noise;

a volume converter configured to map volume of the speech in response to the sound pressure of the noise;

a speech synthesizer configured to synthesize speech guidance into a sound file; and a volume controller configured to control the speaker to output the sound file according to the mapped volume.

2. The apparatus of claim 1, further comprising a scenario engine configured to provide the processor with information for the speech utterance state, the speech receiving state, or the temporal length state, of the noise.

3. The apparatus of claim 1, wherein the exception processor is further configured to perform the exception processing based on a minimum unit of an uttered sound, when the apparatus is in the speech utterance state and the output is text to speech (TTS) output.

4. The apparatus of claim 1, wherein the exception processor is further configured to:
cause the sound pressure calculator to not calculate the sound pressure of the noise received at microphone, or
cause the sound pressure calculator to reduce the sound pressure of the noise by a preset ratio and calculate the reduced sound pressure of the noise.

5. The apparatus of claim 1, wherein the exception processor is further configured to:
perform the exception processing while waiting for speech from a user, when a start-up word from the user is received by the microphone.

6. The apparatus of claim 1, wherein the volume converter is further configured to:
map the volume of the speech at a first slope in response to a relative increase in the sound pressure of the noise; and
map the volume of the uttered speech at a second slope in response to a relative decrease in the sound pressure of the noise,
wherein an absolute value of the first slope is smaller than an absolute value of the second slope.

7. The apparatus of claim 1, wherein the volume converter is further configured to:
divide a section of the sound pressure of the noise into a first section, a second section, and a third section, wherein the sound pressure of the second section is larger than the sound pressure of the first section, and wherein the sound pressure of the third section is larger than the sound pressure of the second section;
map the volume to increase to a first slope in response to the calculated sound pressure of the noise being included within the first section;
map the volume to increase to a second slope in response to the calculated sound pressure of the noise being included within the second section; and
map the volume to increase to a third slope in response to the calculated sound pressure of the noise being included within the third section,
wherein the second slope is larger than the first slope and the third slope.

8. A robot, comprising:
a storage device configured to store noise information of a space of locations at which the robot has traveled;
a moving unit configured to cause movement of the robot;
a controller configured to control the moving unit and functions for the robot; and
a volume control apparatus comprising:

a microphone configured to receive external noise and speech of a user;
a speaker;
a microphone configured to receive external noise and speech of a user;
a noise sound pressure calculator configured to calculate sound pressure of the noise received by the microphone;
a processor configured to perform exception processing of the sound pressure of some or all of the noise using the calculated sound pressure and one of a speech utterance state, a speech receiving state, or a temporal length state, of the noise;
a volume converter configured to map volume of the speech in response to the sound pressure of the noise;
a speech synthesizer configured to synthesize speech guidance into a sound file; and
a volume controller configured to control the speaker to output the sound file according to the mapped volume.

9. The robot of claim 8, further comprising a scenario engine configured to provide the processor with information for the speech utterance state, the speech receiving state, or the temporal length state, of the noise.

10. The robot of claim 8, wherein the exception processor is further configured to:
cause the sound pressure calculator to not calculate the sound pressure of the noise received at microphone, or
cause the sound pressure calculator to reduce the sound pressure of the noise by a preset ratio and calculate the reduced sound pressure of the noise.

11. The robot of claim 8, wherein the exception processor is further configured to:
perform the exception processing while waiting for speech from a user, when a start-up word from the user is received by the microphone.

12. The robot of claim 8, wherein the volume converter is further configured to:
map the volume of the speech at a first slope in response to a relative increase in the sound pressure of the noise; and
map the volume of the uttered speech at a second slope in response to a relative decrease in the sound pressure of the noise,
wherein an absolute value of the first slope is smaller than an absolute value of the second slope.

13. The robot of claim 8, wherein the volume converter is configured to apply a sigmoid function in the calculation of the mapping of the volume of the speech in response to the sound pressure of the noise.

14. The robot of claim 8, wherein the controller is configured to accumulatively store the sound pressure of the noise as noise information in the storage device with respect to position information on the received noise; and
when a deviation of the noise information is equal to or less than a predetermined level, and the robot moves to a position associated with the position information, the volume converter maps the volume in response to an average value of the stored noise information.

15. The robot of claim 14, wherein the exception processor is further configured to not instruct the noise sound pressure calculator to do the exception processing when a difference between the noise information at the position and the noise sound pressure is equal to or less than a predetermined level.

16. A method for controlling volume in an apparatus having a speaker and a microphone, the method comprising:

receiving, at the microphone, external noise and speech of a user;

calculating sound pressure of the noise received by the microphone;

performing exception processing of the sound pressure of some or all of the noise using the calculated sound pressure and one of a speech utterance state, a speech receiving state, or a temporal length state, of the noise;

mapping volume of the speech in response to the sound pressure of the external noise;

synthesizing speech guidance into a sound file; and outputting the sound file, via the speaker, according to the mapped volume.

17. The method of claim 16, further comprising:

providing information for the speech utterance state, the speech receiving state, or the temporal length state, of the noise.

18. The method of claim 16, further comprising:

not calculating the sound pressure of the noise received at microphone, or reducing the sound pressure of the noise by a preset ratio and calculates the reduced sound pressure of the noise.

19. The method of claim 16, further comprising:

mapping the volume of the speech at a first slope in response to a relative increase in the sound pressure of the noise; and mapping the volume of the uttered speech at a second slope in response to a relative decrease in the sound pressure of the noise, wherein an absolute value of the first slope is smaller than an absolute value of the second slope.

20. The method of claim 16, further comprising:

dividing a section of the sound pressure of the noise into a first section, a second section, and a third section, wherein the sound pressure of the second section is larger than the sound pressure of the first section, and wherein the sound pressure of the third section is larger than the sound pressure of the second section;

mapping the volume to increase to a first slope in response to the calculated sound pressure of the noise being included within the first section;

mapping the volume to increase to a second slope in response to the calculated sound pressure of the noise being included within the second section; and mapping the volume to increase to a third slope in response to the calculated sound pressure of the noise being included within the third section, wherein the second slope is larger than the first slope and the third slope.

* * * * *